(12) United States Patent
Shibuya

(10) Patent No.: US 12,730,009 B2
(45) Date of Patent: Sep. 8, 2026

(54) COMPOSITE MATERIAL, BOLOMETER, AND COMPOSITE MATERIAL FORMING METHOD

(71) Applicant: NEC Corporation, Tokyo (JP)

(72) Inventor: Akinobu Shibuya, Tokyo (JP)

(73) Assignee: NEC CORPORATION, Tokyo (JP)

( * ) Notice: Subject to any disclaimer, the term of this patent is extended or adjusted under 35 U.S.C. 154(b) by 146 days.

(21) Appl. No.: 18/677,958

(22) Filed: May 30, 2024

(65) Prior Publication Data

US 2024/0410759 A1 Dec. 12, 2024

(30) Foreign Application Priority Data

Jun. 12, 2023 (JP) ................................ 2023-096015
Feb. 28, 2024 (JP) ................................ 2024-028280

(51) Int. Cl.

| | |
|---|---|
| ***G01J 5/20*** | (2006.01) |
| ***G01J 5/08*** | (2022.01) |
| ***H10F 30/10*** | (2025.01) |
| ***H10F 77/14*** | (2025.01) |

(52) U.S. Cl.
CPC ............... *G01J 5/20* (2013.01); *G01J 5/0853* (2013.01); *H10F 30/10* (2025.01); *H10F 77/1437* (2025.01); *G01J 2005/204* (2013.01)

(58) Field of Classification Search
CPC ...... G01J 5/20; G01J 5/0853; G01J 2005/204; H10F 77/1437; H10F 30/10
See application file for complete search history.

(56) References Cited

U.S. PATENT DOCUMENTS

2023/0288262 A1* 9/2023 Yuge ....................... H10F 30/10

FOREIGN PATENT DOCUMENTS

| | | | | |
|---|---|---|---|---|
| CN | 119325452 A | * | 1/2025 | C01B 32/17 |
| JP | 2020180185 A | * | 11/2020 | C09C 3/10 |
| WO | 2021/241575 A1 | | 12/2021 | |

* cited by examiner

*Primary Examiner* — Uzma Alam
*Assistant Examiner* — Fani Polyzos Boosalis
(74) *Attorney, Agent, or Firm* — Sughrue Mion, PLLC

(57) ABSTRACT

A composite material includes a film containing oxide particles having a particle size of at least 0.4 μm or more, and carbon nanotubes forming a network on a surface of the oxide particles.

14 Claims, 13 Drawing Sheets

START

ST1 CREATE SOLUTION

ST2 CREATE FIRST SUSPENSION

ST3 STIR FIRST SUSPENSION

ST4 FILTER AND DRY FIRST SUSPENSION

ST5 CREATE CARBON NANOTUBE DISPERSION LIQUID

ST6 CREATE THIRD SUSPENSION

ST7 ULTRASONICALLY DISPERSE THIRD SUSPENSION

ST8 TREAT SUBSTRATE WITH SILANE COUPLING AGENT

ST9 FORM FILM

END

MODIFIED OXIDE PARTICLES
4
4
ST4
ST3
101
OXIDE PARTICLES
X
ST2

FIG. 25

COMPOSITE MATERIAL, BOLOMETER, AND COMPOSITE MATERIAL FORMING METHOD

CROSS-REFERENCE TO RELATED APPLICATION

Priority is claimed on Japanese Patent Application No. 2023-096015, filed Jun. 12, 2023 and Japanese Patent Application No. 2024-028280, filed Feb. 28, 2024, the contents of which are incorporated herein by reference.

TECHNICAL FIELD

The present disclosure relates to a composite material, a bolometer, and a composite material forming method.

BACKGROUND ART

It is known that carbon nanotubes are used in infrared sensors such as bolometers.

For example, International Publication No. WO 2021/241575 (hereinafter Patent Document 1) discloses that a thin film containing a mixture of semiconducting carbon nanotubes and a negative thermal expansion material is applied to a bolometer material.

SUMMARY

In a bolometer material disclosed in Patent Document 1, it may be difficult to form a network of carbon nanotubes when a thin film containing a mixture of semiconducting carbon nanotubes and a negative thermal expansion material is formed.

An example object of the present disclosure is to provide a composite material, a bolometer, and a composite material forming method for solving the above-mentioned problems.

A composite material according to one example aspect of the present disclosure includes a film containing oxide particles having a particle size of at least 0.4 μm or more, and carbon nanotubes forming a network on a surface of the oxide particles.

A composite material forming method according to one example aspect of the present disclosure includes creating a solution containing a silane coupling agent, adding powder containing oxide particles to the solution to create a suspension, creating a carbon nanotube dispersion liquid, creating a liquid containing the carbon nanotube dispersion liquid and the powder, and dripping the liquid containing the carbon nanotube dispersion liquid and the powder to form a film containing oxide particles having a particle size of at least 0.4 μm or more.

A composite material forming method according to one example aspect of the present disclosure includes forming a porous film containing the oxide particles by dripping a suspension containing oxide particles having a particle size of at least 0.4 μm or more and drying the suspension, and impregnating a carbon nanotube dispersion liquid into the porous film.

According to the above-described example aspect, it is easy to form a network of carbon nanotubes.

BRIEF DESCRIPTION OF THE DRAWINGS

FIG. 25 is a graph showing a relationship between a resistance value and a temperature coefficient of resistance of a test element in Example 2.

EXAMPLE EMBODIMENT

Figures 1, 2:
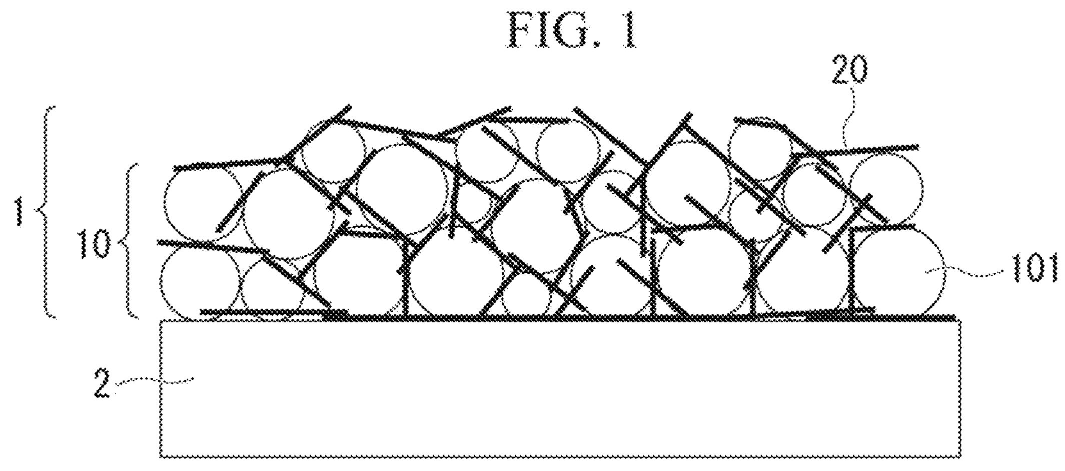
FIG. 1 is a side view of a composite material in some example embodiments of the present disclosure.
FIG. 2 is a flowchart of a composite material forming method in some example embodiments of the present disclosure.

Hereinafter, example embodiments according to the present disclosure will be described with reference to the drawings. The drawings and specific configurations used in the example embodiments should not be used to analyze the disclosure. In all of the drawings, the same or corresponding configurations are given the same reference numerals, and repeated descriptions are omitted.

Hereinafter, some example embodiments of the present disclosure will be described with reference to FIGS. 1 to 4.

(Configuration of Composite Material)

As shown in FIGS. 1 and 2, a composite material 1 includes a film 10 and carbon nanotubes 20.

For example, the composite material 1 has a temperature coefficient of resistance that shows a negative value.

For example, the composite material 1 has a temperature coefficient of resistance whose absolute value is 2.5%/K or more, and the temperature coefficient of resistance in the composite material 1 is a value when the ambient temperature is changed from 20° C. to 25° C.

For example, the composite material 1 has a sheet resistance of 30 MΩ or less at an ambient temperature of 20° C.

The thickness of the composite material 1 can be set as appropriate. For example, the thickness of the composite material 1 is 2 μm to 6 μm.

The film 10 includes oxide particles 101.

For example, the oxide particles 101 may have a granular form.

Furthermore, the particle size of the oxide particle 101 may be substantially the same as the length of the carbon nanotube 20.

As the particle size of the oxide particle 101 increases, it becomes easier to form a three-dimensional structure for the carbon nanotube 20 having a large length.

As the particle size of the oxide particles 101 decreases, it becomes easier to form a three-dimensional structure for the carbon nanotube 20 having a small length.

For example, the oxide particle 101 has a particle size of at least 0.4 μm or more in a microscopic image to be described below. For example, the oxide particle 101 may have a size of 0.4 μm or more and 1.5 μm or less. For example, the oxide particle 101 may have a size of 0.5 μm or more and 1.5 μm or less. For example, the oxide particle 101 may have a size of 0.6 μm or more and 1.5 μm or less. For example, the oxide particle 101 may have a size of 0.7 μm or more and 1.5 μm or less. For example, the oxide particle 101 may have a size of 1.2 μm or more and 1.5 μm or less.

When the oxide particles 101 have a particle size within the above-described range, it becomes easier to form a three-dimensional network structure of the carbon nanotubes 20 to be described below. In addition, this increases the number of conductive paths of the carbon nanotubes 20, and the composite material 1 easily obtains a low resistance value.

For example, the film 10 may be laminated on the top of a substrate 2.

Examples of the oxide particle 101 include oxides containing one type or two or more types of elements of Li, Al, Fe, Ni, Co, Mn, Bi, La, Cu, Sn, Zn, V, Zr, Pb, Sm, Y, W, Si, P, Ru, Ti, Ge, Ca, Ga, Cr, Cd, Mg, and Er, but are not limited thereto. For example, the oxide particles 101 may contain two or more types of oxides.

For example, the oxide particles 101 contain $Zn_{2-x}TxP_2O_7$ (T is at least one type of element selected from Mg, Al, Si, Ti, V, Cr, Mn, Fe, Co, Ni, Cu, Ga, Ge, Zr, Nb, Mo, Ag, In, Sn, Sb, La, Ta, W, and Bi, and $0<x<2$ is satisfied). The oxide defined by the above-described chemical formula is a pyrophosphate.

For example, the oxide particles 101 contain $Zn_{2-z}Mg_zP_2O_7$ ($0\leq z\leq 2$) (hereinafter referred to as ZMPO). ZMPO is included in pyrophosphates.

For example, the oxide particles 101 contain $Zn_{2-z}Mg_zP_2O_7$ ($z=0.4$).

For example, the oxide particles 101 exhibit insulating properties. The oxide particles 101 containing ZMPO are an insulating material.

For example, the film 10 may contain a silane coupling agent. An operator modifies the oxide particles 101 with the silane coupling agent to improve the adhesion of the carbon nanotubes 20 to the oxide particles 101.

For example, the silane coupling agent is 3-aminopropyltriethoxysilane (APTES).

For example, the carbon nanotubes 20 are single-walled, double-walled, or multi-walled carbon nanotubes.

For example, the carbon nanotube 20 is a semiconductor carbon nanotube.

For example, the carbon nanotube 20 has a diameter of 0.7 nm to 1.5 nm.

For example, the carbon nanotube 20 has a length of 100 nm to 1.5 μm.

In the composite material 1 according to the present example embodiments, a plurality of carbon nanotubes 20 are dispersed to form a network on the surface of the oxide particles 101 in the film 10 formed by an aggregation of the oxide particles 101. The film 10 constitutes a network structure formed by intertwining a plurality of carbon nanotubes. This network has a three-dimensional network structure.

(Composite Material Forming Method)

A composite material forming method for a composite material in the present example embodiments will be described.

Figure 3:
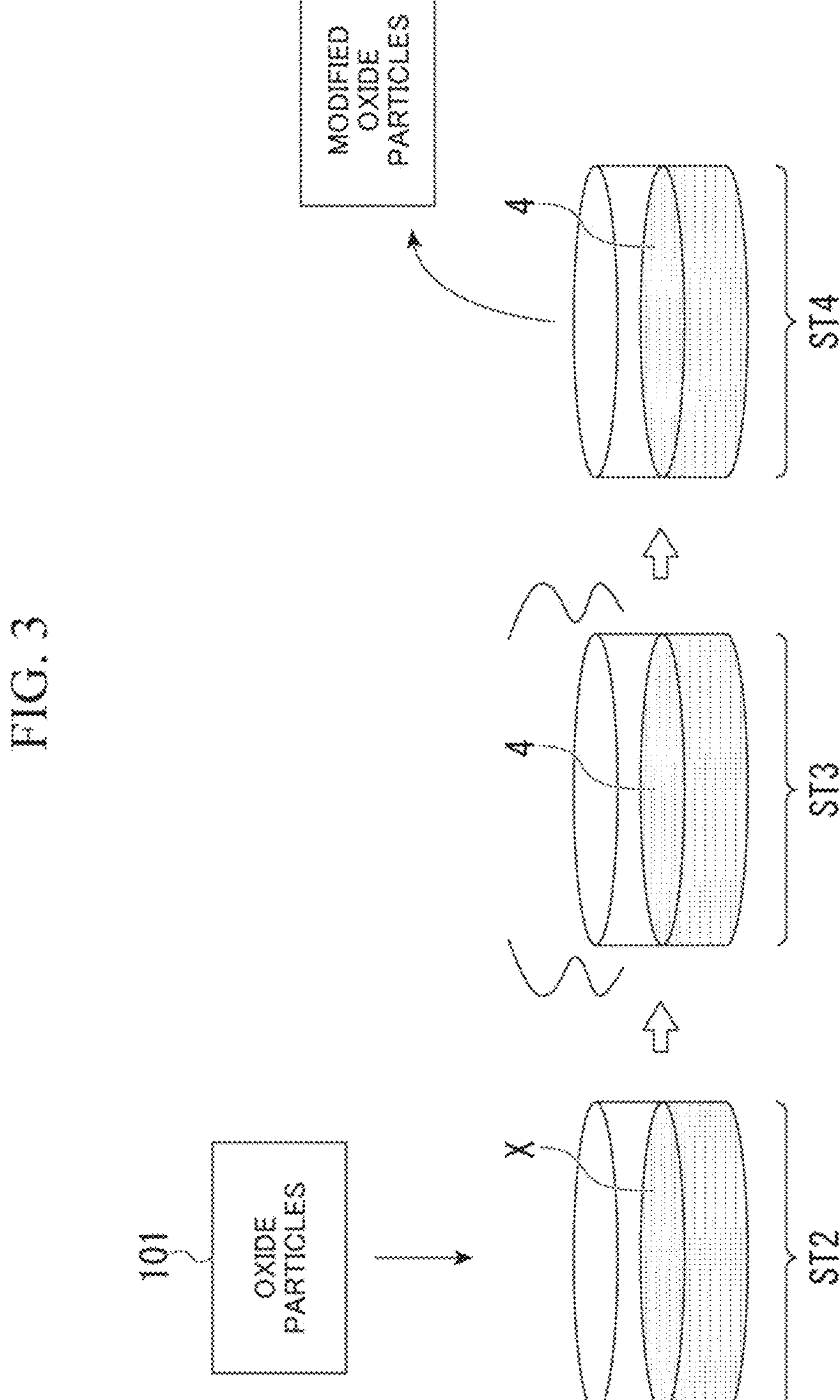
FIG. 3 is a diagram I showing a forming procedure of a composite material forming method in some example embodiments of the present disclosure.
Figure 4:
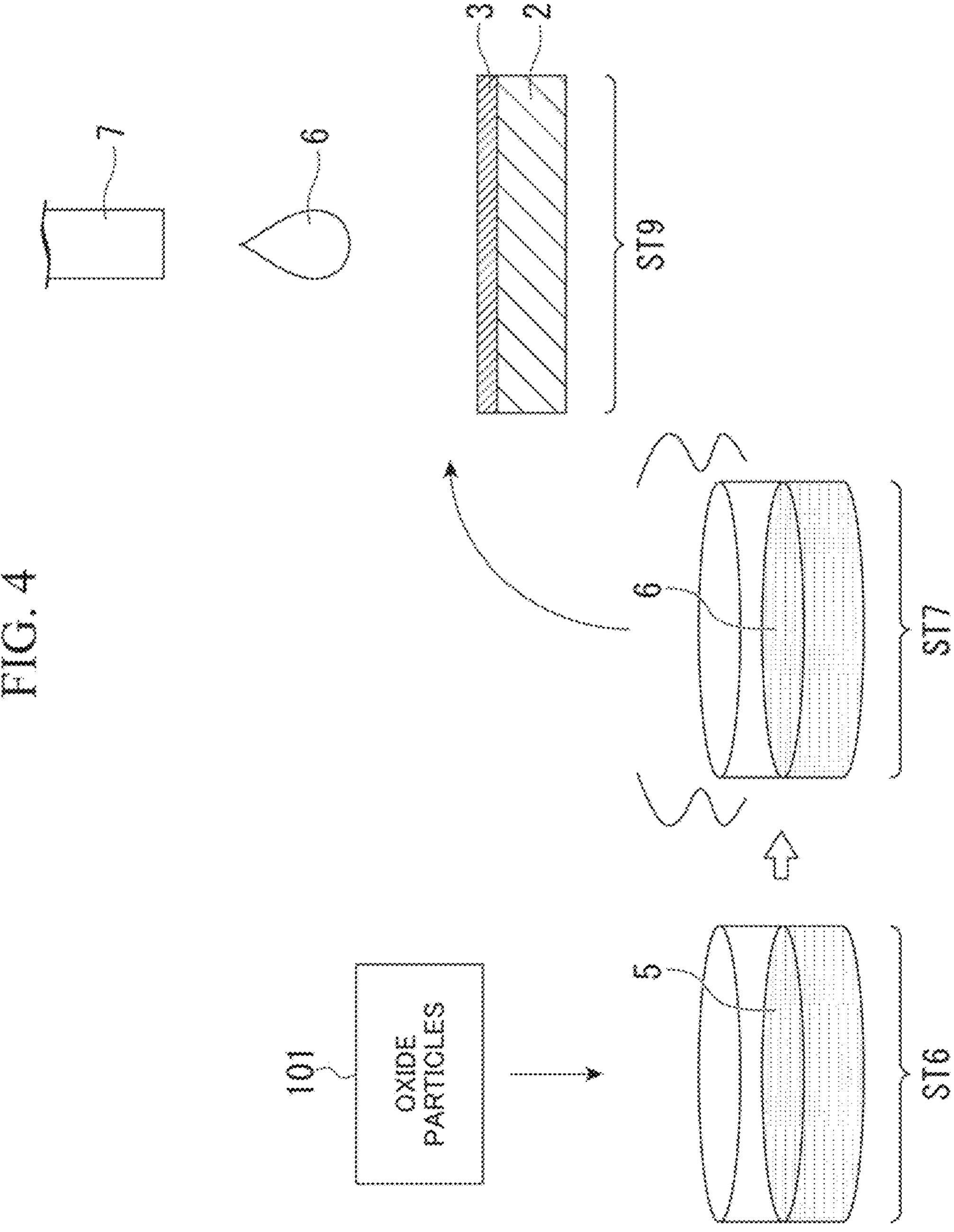
FIG. 4 is a diagram II showing a forming procedure of a composite material forming method in some example embodiments of the present disclosure.

The composite material forming method for a composite material in the present example embodiments is carried out in accordance with a flow shown in FIG. 2. Supplementary diagrams for each flow are also shown in FIGS. 3 and 4.

First, an operator creates a solution containing a silane coupling agent (ST1).

For example, an operator prepares a solution X in which a silane coupling agent is dissolved in an ethanol solution.

For example, the silane coupling agent is 3-aminopropyltriethoxysilane (APTES).

For example, the solution X contains APTES at a concentration of 0.5 wt %.

Next, the operator adds powder containing the oxide particles 101 to the solution containing a silane coupling agent to prepare a first suspension (suspension) (ST2).

For example, the powder contains oxide particles 101 with a particle size of at least 0.4 μm or more.

The particle size of the oxide particle 101 contained in a first suspension 4 is an average particle size at D50 (particle size at a cumulative frequency of 50%) of a volume particle size distribution measured by laser light scattering.

Thus, when particles of raw material powder are aggregated, the size of the aggregated particles rather than a primary particle size, which is a particle size of a single particle, is reflected.

For example, the operator adds powder containing the oxide particles 101 containing ZMPO to the solution containing a silane coupling agent. For example, the operator adds 1 g of the powder containing ZMPO to 50 mL of the solution containing a silane coupling agent.

Next, the operator stirs the solution (first suspension 4) containing the silane coupling agent to which the powder has been added (ST3).

For example, the operator stirs the solution containing a silane coupling agent and the oxide particles 101 containing ZMPO for 6 hours in a room temperature environment.

Next, the operator washes the first suspension 4 with water and filters and dries it (ST4). As a result, the operator can create powder containing oxide particles 101 modified with a silane coupling agent. Modification with a silane coupling agent improves the adhesion of the carbon nanotubes 20 to the oxide particles 101.

Next, the operator creates a carbon nanotube dispersion liquid 5 (ST5). For example, the carbon nanotube dispersion liquid 5 may contain carbon nanotubes at a concentration of 0.0019 wt % to 0.0039 wt %. For example, the carbon nanotube dispersion liquid 5 may contain carbon nanotubes at a concentration of 0.0024 wt % to 0.0034 wt %.

For example, the operator adds a surfactant to a dispersion medium and creates the carbon nanotube dispersion liquid 5 in which the carbon nanotubes 20 are dispersed.

The dispersion medium is not particularly limited as long as it is a solvent that can disperse and suspend carbon nanotubes in ST7, which will be described later. For example, water, heavy water, an organic solvent, an ionic liquid, or a mixture thereof can be used.

The operator can sufficiently disperse the carbon nanotubes 20 by using a surfactant. In addition, the surfactant may be nonionic. Nonionic surfactants are more easily removed than ionic surfactants.

Examples of the nonionic surfactant include polyoxyethylene alkyl ether solutions such as polyoxyethylene (100) stearyl ether or polyoxyethylene (23) lauryl ether.

Next, the operator creates a third suspension 6 containing carbon nanotubes 20 and powder containing oxide particles 101 (liquid containing the carbon nanotube dispersion liquid and the powder) (ST6).

As an example, the operator adds the powder containing the oxide particles 101 modified with the silane coupling agent prepared in ST4 to the carbon nanotube dispersion liquid 5. For example, the third suspension 6 may contain the oxide particles 101 at a proportion of 0.02 vol % to 0.25 vol %.

Next, the operator ultrasonically disperses the third suspension 6 created in ST6 (ST7).

Next, the operator treats the substrate 2 with a silane coupling agent (ST8).

For example, the silane coupling agent used for the substrate 2 is APTES. The operator modifies the surface of the substrate 2 with amino groups by treating the substrate 2 with APTES. Thereby, the adhesion of the carbon nanotubes 20 to the substrate 2 is improved.

Next, the operator drips the third suspension 6 onto the substrate 2 to form the film 10 (ST9).

For example, a nozzle 7 is included in a dispenser, an inkjet, or the like.

For example, the operator applies the third suspension 6 in which the carbon nanotubes 20 and oxide particles in powder 101*a* are mixed onto the substrate 2 from the nozzle 7. Thereafter, the operator dries the substrate 2 at room temperature, and then dries the substrate 2 in an environment of 110° C. for 2 hours. After drying, the operator washes the substrate 2 with water, and then bakes the substrate 2 in a 180° C. environment for 2 hours. By these operations, a composite material 1 containing the oxide particles 101 is formed on the substrate 2 (completion).

Actions and Effects

According to the composite material 1 of the present example embodiments, the oxide particles 101 each having a certain particle size with respect to the length of the carbon nanotubes 20 are included in the film 10, and thus the carbon nanotubes 20 can be attached to lean against the surface of the oxide particles 101, and the carbon nanotubes 20 can be easily arranged three-dimensionally.

Thus, when the carbon nanotubes 20 are arranged three-dimensionally, it is possible to form the film 10 with a thickness of the nm order, and it becomes easier to form a three-dimensional network of CNTs.

From the above, according to the composite material 1 of the present disclosure, it is easy to form a network of carbon nanotubes 20.

Furthermore, the composite material 1 allows the carbon nanotubes 20 to be easily arranged three-dimensionally, thereby increasing the number of conductive paths of the carbon nanotubes 20 in a network structure. For this reason, the composite material 1 easily obtains a low resistance value.

Furthermore, according to one of the present example embodiments, there is the film 10 formed of the oxide particles 101 having exceptional adsorption properties for the carbon nanotubes 20, and a carbon nanotube network is formed on the surface of the oxide particles 101.

Furthermore, since the oxide particles 101 are an insulating material, the composite material 1 makes it easy to form a network structure that takes advantage of network characteristics of the carbon nanotubes 20.

In an example of some example embodiments of the present disclosure described above, the operator creates the third suspension 6 by adding the oxide particles 101 to the carbon nanotube dispersion liquid 5, but the operator may add the carbon nanotubes 20 to a suspension in which the oxide particles 101 are dispersed.

Some example embodiments of the present disclosure described above disclose the composite material 1 that makes it easy to form a three-dimensional network structure by adding oxide particles 101 each having a specific particle size to a network structure of only the carbon nanotubes 20.

On the other hand, a bolometer according to some example embodiments of the present disclosure includes the composite material 1 in a light receiving part that detects infrared rays. The bolometer according to the present example embodiments also focuses on the fact that the composite material 1 makes it easy to arrange the carbon nanotubes 20 three-dimensionally, which increases the number of conductive paths of the carbon nanotubes 20 in a network structure and makes it easy to obtain a low resistance value.

Figure 5:
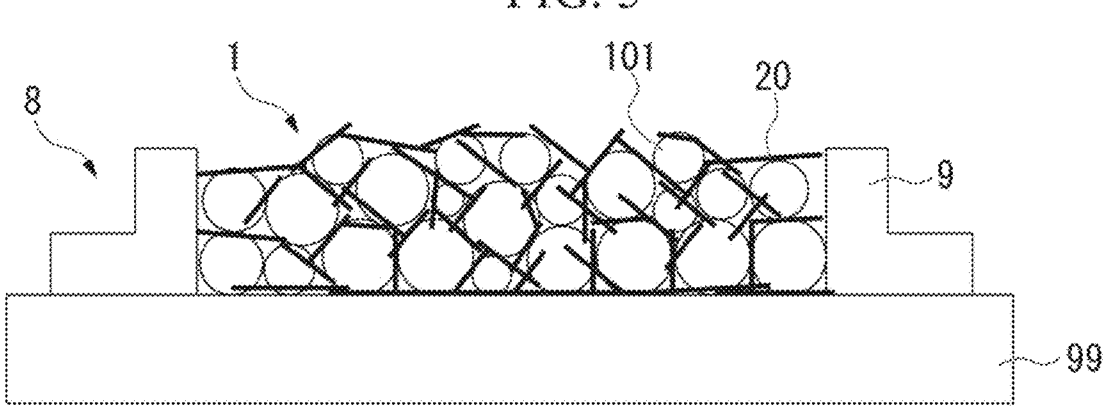
FIG. 5 is a side view of a bolometer in some example embodiments of the present disclosure.

Hereinafter, a bolometer 8 according to some example embodiments of the present disclosure will be described with reference to FIG. 5.

(Configuration of Bolometer)

The bolometer 8 includes the composite material 1, a base substrate 99, and an electrode 9 electrically connected to the carbon nanotubes 20.

The bolometer 8 is used as a sensor for detecting infrared rays.

The composite material 1 is an infrared light receiving part.

The composite material 1 is disposed on the base substrate 99.

Actions and Effects

According to the present example embodiments, the composite material 1 included in the bolometer 8 includes the oxide particles 101 each having a certain particle size with respect to the length of the carbon nanotube 20 in the film 10, and thus it is possible to make it easy to three-dimensionally arrange the carbon nanotubes 20 attached to the oxide particles 101.

Thus, the bolometer 8 easily forms a network of carbon nanotubes.

In addition, the composite material 1 included in the bolometer 8 can make it easy to arrange the carbon nanotubes 20 three-dimensionally, thereby increasing the number of conductive paths of the carbon nanotubes 20 in a network structure, and the composite material 1 easily obtains a low resistance value. Thus, the resistance value of the composite material 1 is decreased, and thus it is easy to decrease the resistance value of the bolometer 8.

Figure 6:
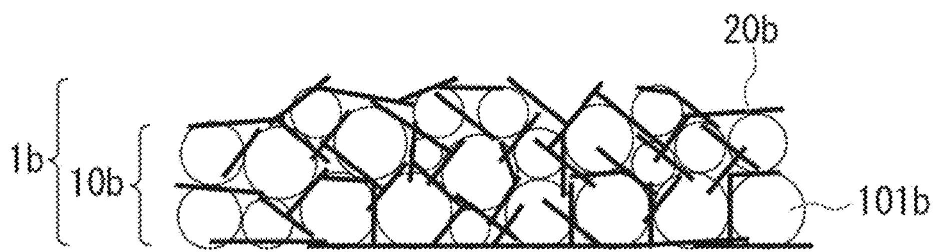
FIG. 6 is a side view of a composite material in some example embodiments of the present disclosure.

Hereinafter, some example embodiments of the present disclosure will be described with reference to FIG. 6.

(Configuration)

A composite material 1*b* includes a film 10*b* containing oxide particles 101*b* having a particle size of at least 0.4 μm or more, and carbon nanotubes 20*b* forming a network on the surface of the oxide particles 101*b*.

Actions and Effects

According to the present example embodiments, the composite material 1*b* includes the oxide particles 101*b* having a certain particle size with respect to the length of the carbon nanotubes 20*b* in the film 10*b*, and thus it is possible to make it easy to three-dimensionally arrange the carbon nanotubes 20*b* attached to the oxide particles 101*b*.

Thus, it is easy to form a network of the carbon nanotubes 20*b*.

Hereinafter, some example embodiments of the present disclosure will be described with reference to FIG. 7.

Figure 7:
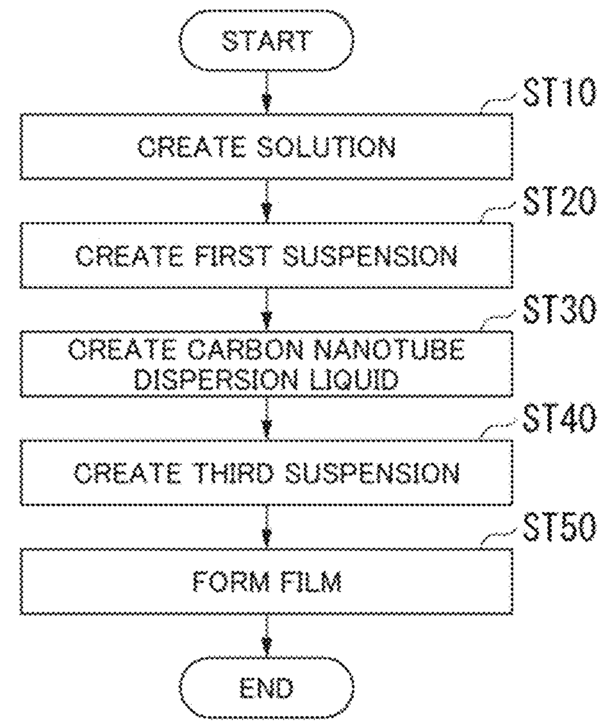
FIG. 7 is a flowchart of a composite material forming method in some example embodiments of the present disclosure.

A composite material forming method in the present example embodiments is carried out in accordance with a flow shown in FIG. 7.

The composite material forming method includes a step of creating a solution containing a silane coupling agent (ST10), a step of adding powder containing oxide particles to the solution containing the silane coupling agent to create a first suspension (ST20), a step of creating a carbon nanotube dispersion liquid (ST30), a step of creating a third suspension containing the carbon nanotube the dispersion liquid and the powder (ST40), and a step of dripping the third suspension to form a film containing oxide particles having a particle size of at least 0.4 μm or more (ST50).

Actions and Effects

According to the composite material forming method of the present example embodiments, a composite material includes oxide particles having a certain particle size with respect to the length of carbon nanotubes in a film, and thus it is possible to make it easy to three-dimensionally arrange the carbon nanotubes attached to the oxide particles.

Thus, according to the composite material forming method of the present disclosure, it is easy to form a network of carbon nanotubes.

Some example embodiments of the present disclosure described above disclose the composite material 1 that makes it easy to form a three-dimensional network structure by adding the oxide particles 101 having a specific particle size to a network structure of only the carbon nanotubes 20.

On the other hand, a composite material 1F according to some example embodiments of the present disclosure obtains the same effects, but a composite material forming method for the composite material 1F is different. Thereby, it is also noted that bundling of the carbon nanotubes 20 can be suppressed.

Hereinafter, the composite material 1F according to some example embodiments of the present disclosure will be described with reference to FIGS. 8 to 11.

The same reference numerals are given to the same components as those in the above disclosure, and detailed description thereof will be omitted.

(Configuration of Composite Material)

Figure 11:
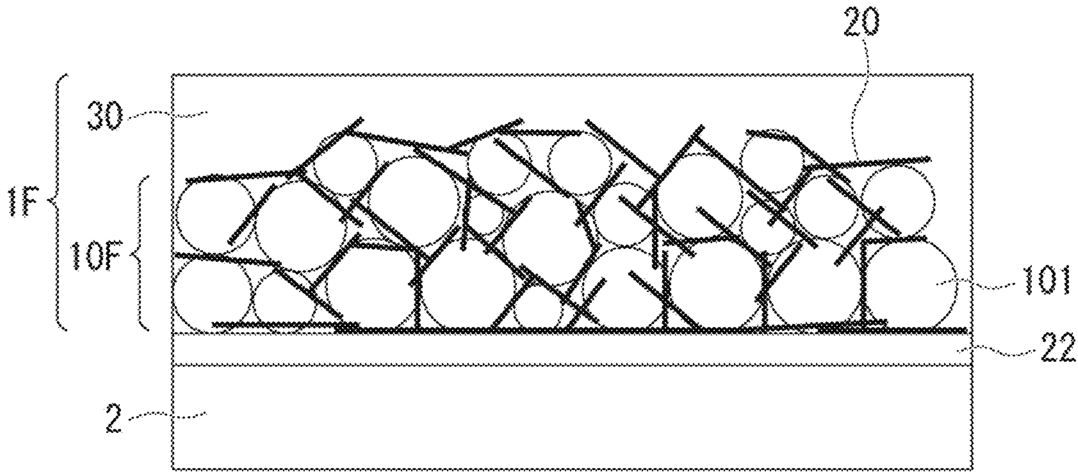
FIG. 11 is a side view of a composite material in some example embodiments of the present disclosure.

As shown in FIG. 11, the composite material 1F includes a porous film 10F, carbon nanotubes 20, and an insulating film 30.

For example, the composite material 1F has a temperature coefficient of resistance that indicates a negative value.

For example, the composite material 1F has a temperature coefficient of resistance whose absolute value is 2.5%/K or more, and the temperature coefficient of resistance of the composite material 1F is a value when the ambient temperature is changed from 25° C. to 30° C.

For example, the composite material 1F has a sheet resistance of 250 MΩ or less at an ambient temperature of 25° C.

The thickness of the composite material 1F can be set as appropriate. For example, the thickness of the composite material 1F is 2 μm to 6 μm.

The porous film 10F is a film containing at least oxide particles having a particle size of 0.4 μm or more.

The porous film 10F contains oxide particles 101.

For example, the porous film 10F may contain a silane coupling agent.

For example, the porous film 10F may be laminated on the top of a substrate 2.

The particle size of the oxide particles 101 in the following disclosure is an average particle size. In the following composite material forming method for the composite material 1F, the average particle size is preferably 0.8 μm or more and 1.5 μm or less. More preferably, the average particle size is 1.0 μm or more and 1.5 μm or less.

(Main Points of Composite Material Forming Method)

In the composite material forming method for the composite material 1F, the oxide particles 101 are fixed onto the substrate, and then a carbon nanotube dispersion liquid is impregnated into the formed porous film 10F. Methods of impregnating the carbon nanotube dispersion liquid include an immersion method and a drip impregnation method.

An example of the drip impregnation method is shown below.

In an example of the drip impregnation method, oxide particles 101 are fixed onto a substrate, and then a carbon nanotube dispersion liquid is dripped and impregnated into the substrate.

(Summary of Composite Material Forming Method)

A composite material forming method for a composite material in some example embodiments of the present disclosure will be described.

Figure 8:
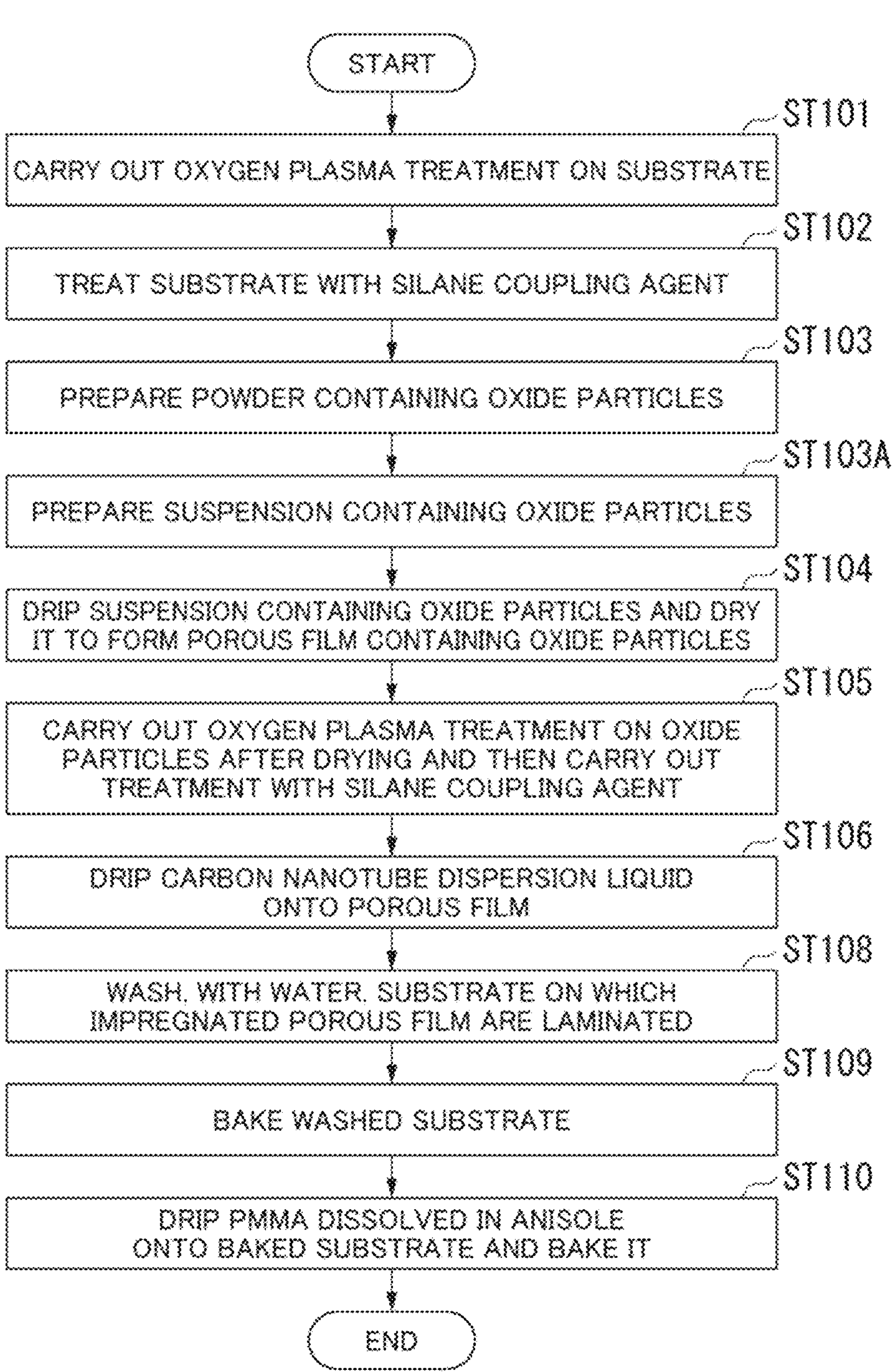
FIG. 8 is a flowchart of a composite material forming method in some example embodiments of the present disclosure.
Figure 9:
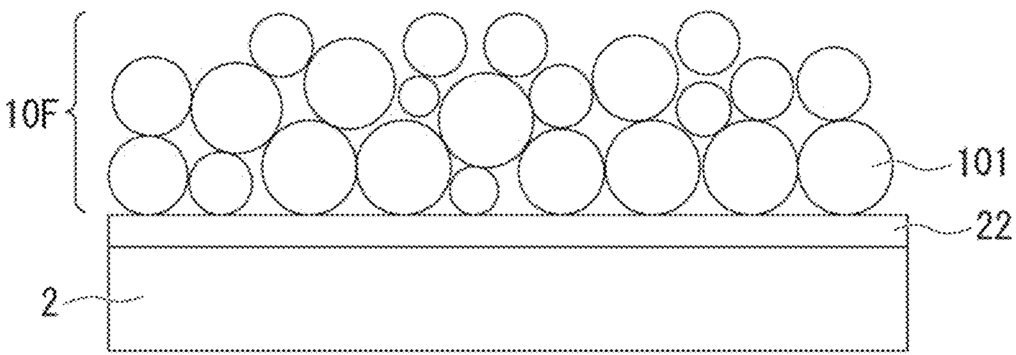
FIG. 9 is a side view I of a porous film in some example embodiments of the present disclosure.
Figure 10:
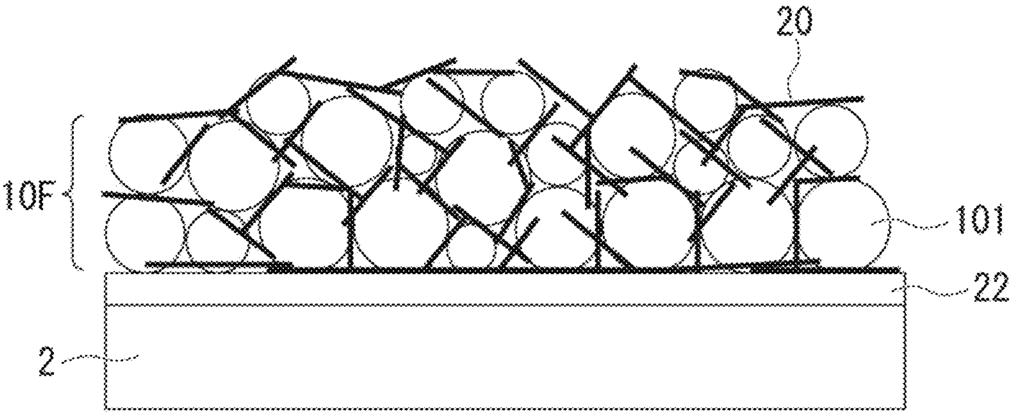
FIG. 10 is a side view II of a porous film in some example embodiments of the present disclosure.

The composite material forming method for the composite material in some example embodiments of the present disclosure is carried out in accordance with a flow shown in FIG. 8. Supplementary diagrams in each flow are also shown in FIGS. 9, 10, and 11. ST103 may be replaced with ST101 or ST102 as appropriate.

First, an operator carries out oxygen plasma treatment on the substrate 2 (ST101).

For example, the operator removes organic substances and the like on the surface of the substrate 2 coated with silicon oxide through the oxygen plasma treatment.

Next, the operator treats the substrate 2 with a silane coupling agent (ST102). Thereby, an adhesion layer 22 is formed on the substrate 2.

For example, the silane coupling agent is 3-aminopropyltriethoxysilane (APTES).

Next, the operator prepares powder containing oxide particles 101 as in some example embodiments of the present disclosure described above (ST103).

In the present disclosure, the powder prepared in ST103 contains the oxide particles 101 containing ZMPO contained in pyrophosphates which will be described later and is a material for creating a composite material 1F that includes a film containing oxide particles having a particle size of at least 0.4 μm or more.

Next, the operator prepares a suspension containing oxide particles 101 (ST103A).

For example, the operator ultrasonically disperses a solution (hereinafter also referred to as a "fourth suspension") in which powder is added to pure water.

For example, the fourth suspension may contain the oxide particles 101 at a proportion of 0.02 vol % to 0.25 vol %.

Here, the proportion of the oxide particles 101 contained in the fourth suspension is a volume ratio of the added powder to the total volume of pure water, which is the material of the fourth suspension, and the added powder.

Next, the operator drips the suspension prepared in ST103A and dries it to form the porous film 10F containing the oxide particles 101 (ST104).

For example, in ST104, the operator may dry the substrate 2 at room temperature, and then dry the substrate 2 in a 110° C. environment for 2 hours.

The porous film 10F formed in ST104 has a large number of holes in which carbon nanotubes 20 can be disposed. These holes are formed between the plurality of aggregated oxide particles 101.

Through ST104, the oxide particles 101 are fixed to the adhesion layer 22 on the surface of the substrate 2, as shown in FIG. 9.

The operator can more easily laminate the oxide particles 101 by dripping the suspension than when applying the suspension.

Next, the operator carries out oxygen plasma treatment on the oxide particles 101 after the drying and then carries out treatment with a silane coupling agent (ST105). Since organic molecules attached to the surface of the oxide particles 101 in the air can be removed through the oxygen plasma treatment, the silane coupling agent can be easily adsorbed uniformly onto the oxide particles 101 after the drying.

For example, it is preferable that the operator fix the oxide particles 101 onto the substrate 2 via the adhesion layer 22 and then carries out silane coupling treatment as in ST105.

For example, the silane coupling agent used in ST105 is APTES. The operator modifies the surface of the oxide particles 101 with amino groups by treating the oxide particles 101 having been subjected to the oxygen plasma treatment with APTES. Thereby, the adhesion of the carbon nanotubes 20 to the oxide particles 101 is improved.

In the composite material forming method for the composite material 1F of the present disclosure, the operator does not need to modify the oxide particles 101 through silane coupling in advance.

Next, the operator drips a carbon nanotube dispersion liquid onto the porous film 10F to impregnate the carbon nanotube dispersion liquid into the porous film 10F (ST106).

For example, the carbon nanotube dispersion liquid may contain carbon nanotubes 20 at a concentration of 0.0019 wt % to 0.0039 wt %. For example, the carbon nanotube dispersion liquid may contain the carbon nanotubes 20 at a concentration of 0.0024 wt % to 0.0034 wt %.

For example, the operator adds a surfactant to a dispersion medium and disperses the carbon nanotubes 20 therein to create the carbon nanotube dispersion liquid.

The dispersion medium used by the operator is not particularly limited as long as it is a solvent that can disperse and suspend carbon nanotubes. For example, water, heavy water, an organic solvent, an ionic liquid, or a mixture thereof can be used.

Additionally, the surfactant may be nonionic. Nonionic surfactants are more easily removed than ionic surfactants.

Examples of the nonionic surfactant include polyoxyethylene alkyl ether solutions such as polyoxyethylene (100) stearyl ether or polyoxyethylene (23) lauryl ether.

Next, the operator washes, with water, the substrate 2 on which the impregnated porous film 10F is laminated (ST108).

Next, the operator bakes the washed substrate 2 in a 180° C. environment for 2 hours.

In this manner, as shown in FIG. 10, the carbon nanotubes 20 are attached to the oxide particles 101, and thus the carbon nanotubes 20 are disposed in a large number of holes of the porous film 10F.

Next, the operator forms the insulating film 30 on the baked substrate 2 and bakes it (ST110).

In this manner, as shown in FIG. 11, the operator forms the insulating film 30 on the porous film 10F on which the carbon nanotubes 20 are disposed.

The insulating film 30 is made of an acrylic resin, an epoxy resin, Teflon (registered trademark), or the like. Examples thereof include PMMA (poly methyl methacrylate), P4VP (poly(4-vinylpyridine)), P4VBM (poly(4-vinylpyridine-co-bytyl methacrylate)), and the like. These resins fix the porous film 10F.

For example, the insulating film 30 may contain PMMA. In the present disclosure, the operator forms the insulating film 30 by dripping a PMMA (poly methyl methacrylate) solution dissolved in anisole and baking it.

The operator bakes the washed substrate 2 in a 200° C. environment for 3 hours. The operator removes an excess solvent, impurities, and the like by heating the substrate 2 at 200° C. or higher.

Through these operations, the composite material 1F containing the oxide particles 101 is formed on the substrate 2 (completion).

Actions and Effects

According to the composite material 1F of the present example embodiments, the oxide particles 101 each having a certain particle size with respect to the length of the carbon nanotubes 20 are included in the porous film 10F, and thus the carbon nanotubes 20 can be attached to lean against the surface of the oxide particles 101, and the carbon nanotubes 20 can be easily arranged three-dimensionally.

Thus, when the carbon nanotubes 20 are arranged three-dimensionally, it is possible to form the porous film 10F with a thickness of the nm order, and it becomes easier to form a three-dimensional network of CNTs.

From the above, according to the composite material 1F of the present disclosure, it is easy to form a network of carbon nanotubes 20.

Furthermore, the composite material 1F allows the carbon nanotubes 20 to be easily arranged three-dimensionally, thereby increasing the number of conductive paths of the carbon nanotubes 20 in a network structure. For this reason, the composite material 1F easily obtains a low resistance value.

Further, according to the composite material 1F of the present example embodiments, there is the porous film 10F formed of the oxide particles 101 having exceptional adsorption properties for the carbon nanotubes 20, and a carbon nanotube network is formed on the surface of the oxide particles 101.

Furthermore, since the oxide particles 101 are an insulating material, the composite material 1F makes it easy to form a network structure that takes advantage of the network characteristics of the carbon nanotubes 20.

Furthermore, according to the composite material 1F of the present example embodiments, the step of forming the porous film 10F using the oxide particles 101 is carried out before the carbon nanotubes 20 are attached to the oxide particles 101.

Thereby, it is possible to reduce the drying time for the carbon nanotube dispersion liquid dripped onto the porous film 10F and suppress bundling of the carbon nanotubes 20.

Thereby, carbon nanotubes are adsorbed onto the surface of the oxide particles 101 included in the porous film 10F, and then excess carbon nanotubes can be removed by washing with water.

Thereby, as will be described later, a bolometer with a large absolute value of a temperature coefficient of resistance (TCR) can be realized. That is, the TCR is improved by suppressing bundling of carbon nanotubes and removing excess carbon nanotubes.

An example has been described assuming that impregnation of a carbon nanotube dispersion liquid is carried out by a drip impregnation method, but a method according to immersion may also be used.

For example, the formed porous film 10F may be impregnated by immersing it in a carbon nanotube dispersion liquid. Thereafter, the immersed porous film 10F is pulled up, and the water washing step of ST108 and the subsequent steps are carried out.

Hereinafter, some example embodiments of the present disclosure will be described with reference to FIG. 12.

Figure 12:
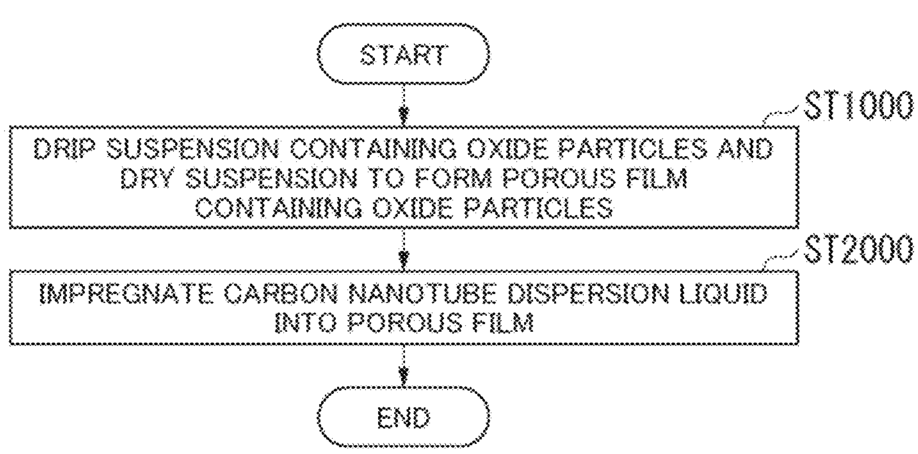
FIG. 12 is a flowchart of a composite material forming method in some example embodiments of the present disclosure.

The composite material forming method in the present example embodiment is carried out in accordance with a flow shown in FIG. 12.

The composite material forming method includes a step of dripping a suspension containing oxide particles having a particle size of at least 0.4 μm or more and drying the suspension to form a porous film containing oxide particles (ST1000), and a step of impregnating the carbon nanotube dispersion liquid into the porous film (ST2000).

Actions and Effects

According to the composite material forming method of the present example embodiments, the composite material includes oxide particles having a certain particle size relative to the length of the carbon nanotubes in the film, so that the carbon nanotubes attached to the oxide particles can be easily disposed three-dimensionally.

Therefore, according to the composite material forming method of the present disclosure, it is easy to form a network of carbon nanotubes.

Furthermore, according to the composite material forming method of the present example embodiments, a step of dripping a suspension containing oxide particles and drying the suspension to form a porous film is carried out before the carbon nanotube dispersion liquid is impregnated into the porous film.

This means that the porous film formation step is carried out before the carbon nanotubes are attached to the oxide particles contained in the porous film.

Thereby, it is possible to suppress bundling of the carbon nanotubes 20.

Furthermore, as will be described later, a bolometer with a large absolute value of a TCR can be realized.

Hereinafter, the effects of the present disclosure will be described more specifically using examples. Conditions in the examples are examples of conditions adopted to confirm the feasibility and effects of the present disclosure, and the present disclosure is not limited to these examples of conditions. The present disclosure may adopt various conditions as long as the objectives of the present disclosure are achieved without departing from the gist of the present disclosure.

Example 1

Figure 13:
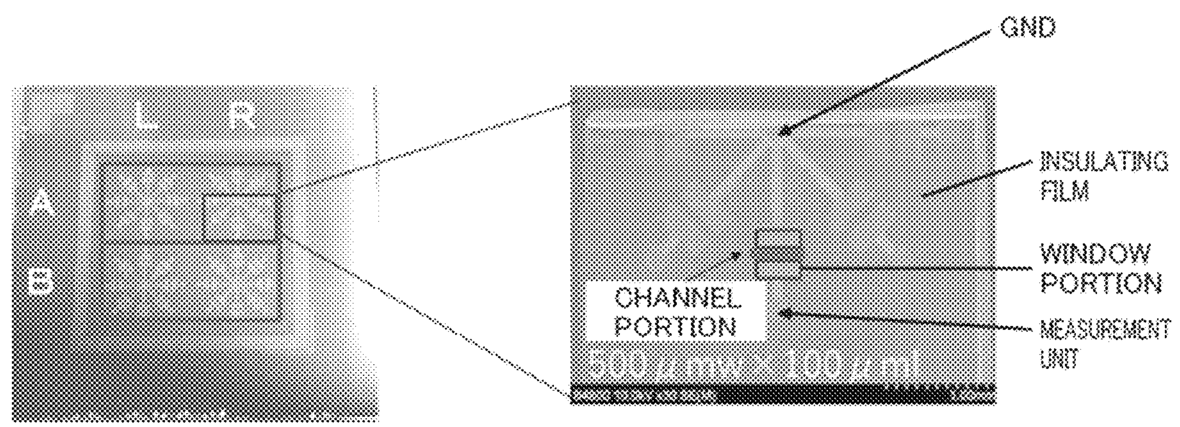
FIG. 13 is a plan view of a test element in an example.

FIG. 13 shows a plan view of a test element.

FIG. 13 is an enlarged view of the lower half of elements that are present in an A row and an R column. A composite material 1 is formed in a channel portion, and I-V measurement is carried out by a measurement unit. There are eight measurement units for each test element.

The size of the channel portion of the test element was 500 μm×100 μm, and the aspect ratio was 5:1.

Figure 14:
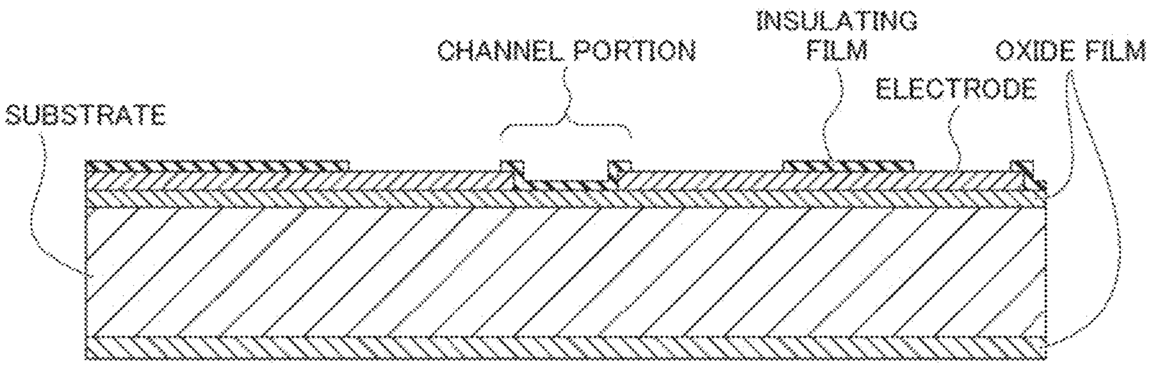
FIG. 14 is a cross-sectional view of a test element in an example.

FIG. 14 shows a cross-sectional view of the test element.

As shown in FIGS. 13 and 14, an insulating film ($SiO_2$) was formed on the surface of the test element with a window portion partially exposing a Ti/Au electrode. The insulating film was formed by sputtering.

Figure 15:
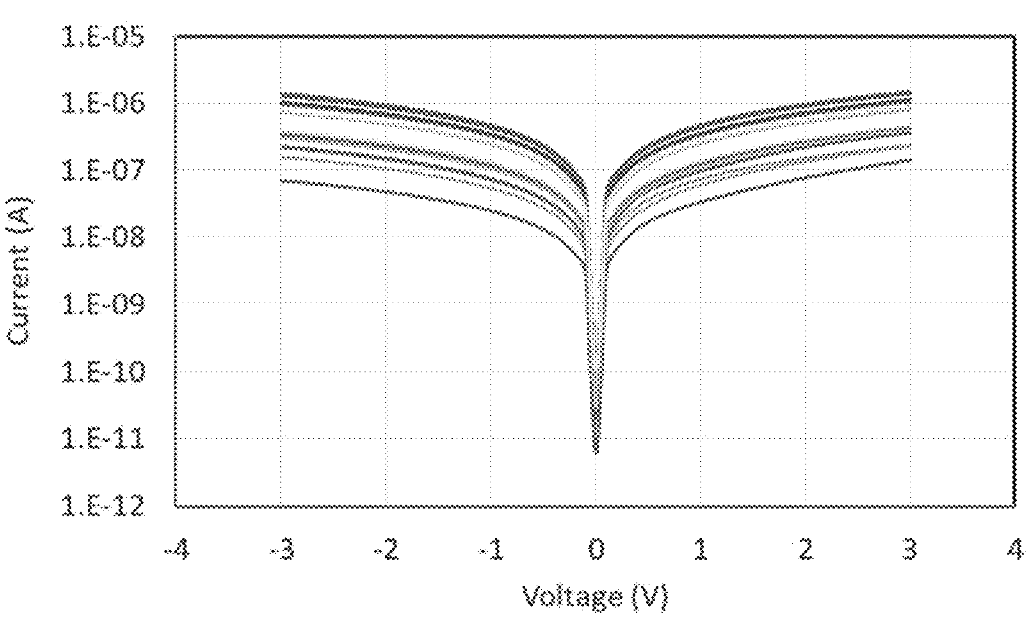
FIG. 15 is a graph showing I-V measurement results when the ambient temperature of a test element in an example is 293 K.

FIG. 15 shows I-V measurement results when the ambient temperature of a test element is 293 K. The test element shows the measurement results of two test elements in the A row.

Figure 16:
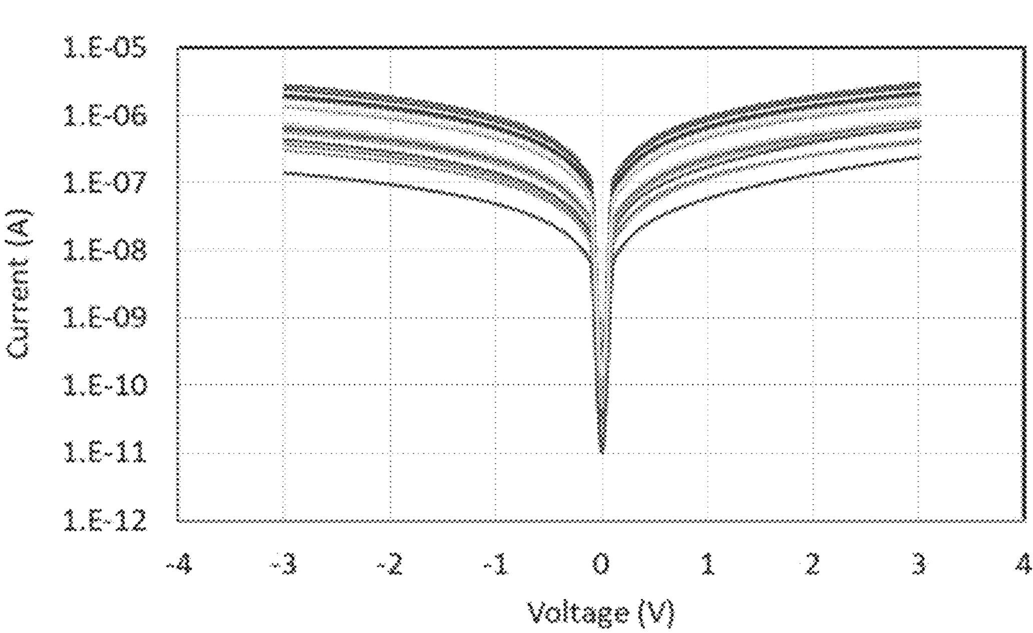
FIG. 16 is a graph showing I-V measurement results when the ambient temperature of a test element in an example is 313 K.

FIG. 16 shows I-V measurement results when the ambient temperature of a test element is 313 K. Similarly to FIG. 15, the test element shows measurement results of two test elements in the A row.

From FIGS. 15 and 16, when the surrounding environment of the test element increased from 293 K to 313 K, the value of Current (A) increased. That is, when the ambient temperature of the test element increased, a temperature coefficient of resistance (TCR) indicating a negative value in which a resistance value decreases was confirmed. In this example, semiconducting carbon nanotubes are used, and thus a negative TCR is shown.

When the TCR of the test element was calculated, measurement was carried out using a semiconductor parameter analyzer. The test element was mounted on a ceramic carrier, disposed in a cryostat, and evacuated, and TCR measurement was carried out while controlling the temperature.

Figure 17:
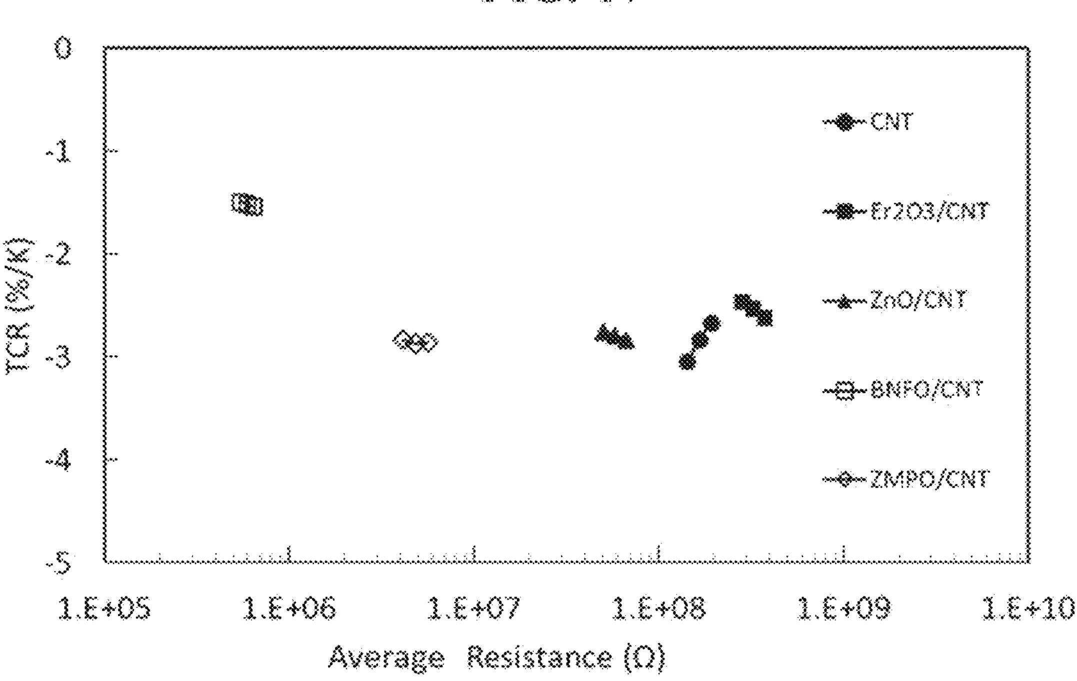
FIG. 17 is a graph showing a relationship between an average resistance value and a temperature coefficient of resistance of a test element in an example.

FIG. 17 shows a relationship between an average resistance value and a TCR of a test element.

For each element having the relationship shown in FIG. 17, a channel portion of a test element is a composite material of an oxide (ZMPO, BNFO, ZnO, $Er_2O_3$) and carbon nanotubes, or carbon nanotubes alone.

When a composite material of ZMPO and carbon nanotubes is created, the concentration of each liquid is adjusted. A solution containing a silane coupling agent contains APTES at a concentration of 0.5 wt %. Oxide particles 101 modified with a silane coupling agent were prepared from the first suspension 4 in which 1 g of powder containing ZMPO is added to 50 mL of the solution containing the silane coupling agent. The carbon nanotube dispersion liquid 5 contains carbon nanotubes at a concentration of 0.0029 wt %. The third suspension 6 contains oxide particles 101 at a proportion of 0.2 vol %.

For an average particle size of the oxide particles 101 contained in the first suspension 4, the value of D50 (particle size at a cumulative frequency of 50%) of a volume particle size distribution measured by laser light scattering was used. The average particle size of ZMPO in this example was 1.0 μm.

Composite materials of the other oxides (BNFO, ZnO, $Er_2O_3$) and carbon nanotubes were also created using the same procedure as ZMPO.

BNFO is $BiNi_{1-y}Fe_yO_3$. (0<y<1)

The carbon nanotube used in this example has a diameter of 1 nm and a length of 1 μm.

Regarding an average thickness of each composite material, an average thickness of the composite material of ZMPO and carbon nanotubes is 5.2 μm. An average thickness of the composite material of BNFO and carbon nanotubes is 4.3 μm. An average thickness of the composite material of ZnO and carbon nanotubes is 2.6 μm. An average thickness of the composite material of $Er_2O_3$ and carbon nanotubes is 5.2 μm.

The elements in FIG. 17 were measured under three conditions of a measured value when the ambient temperature was increased from 25° C. to 30° C., a measured value when the ambient temperature was increased from 20° C. to 25° C., and a measured value when the ambient temperature was increased from 15° C. to 20° C. Each of the values is an average value of measured values obtained by a total of 16 measurement units of two test elements. For a resistance value of each element, an average value of the measured values before the ambient temperature increased was recorded.

From FIG. 17, it can be understood that the composite material of ZMPO and carbon nanotubes had a negative TCR (absolute value of 2.5%/K or more) with the same absolute value as that of only the carbon nanotubes. Furthermore, when a comparison is carried out using resistance values, it can be understood that the composite material of ZMPO and carbon nanotubes had a resistance value smaller than that of only the carbon nanotubes. It was confirmed that the composite material of ZMPO and carbon nanotubes had a sheet resistance of 30 MΩ or less at an ambient temperature of 20° C. The sheet resistance is obtained by multiplying the resistance value shown in FIG. 17 by an aspect ratio (×5). Since ZMPO is an insulating material, it is possible to easily form a network structure that takes advantage of network characteristics of the carbon nanotubes 20, and thus it is considered that the same TCR as that of only the carbon nanotubes is obtained. It is considered that the composite material of ZMPO and carbon nanotubes achieves a low resistance value because the ZMPO contains particles having a specific size, which increases the number of conductive paths of the carbon nanotubes 20 in the network structure.

It can be understood that the composite material of BNFO and carbon nanotubes has a negative TCR having an absolute value smaller than that of only the carbon nanotubes. Furthermore, when comparison is carried out using resistance values, it can be understood that the composite material of BNFO and carbon nanotubes has a resistance value smaller than only the carbon nanotubes. It is considered that the composite material of BNFO and carbon nanotubes achieves a low resistance value for the same reason as in the case of ZMPO.

Figure 18:
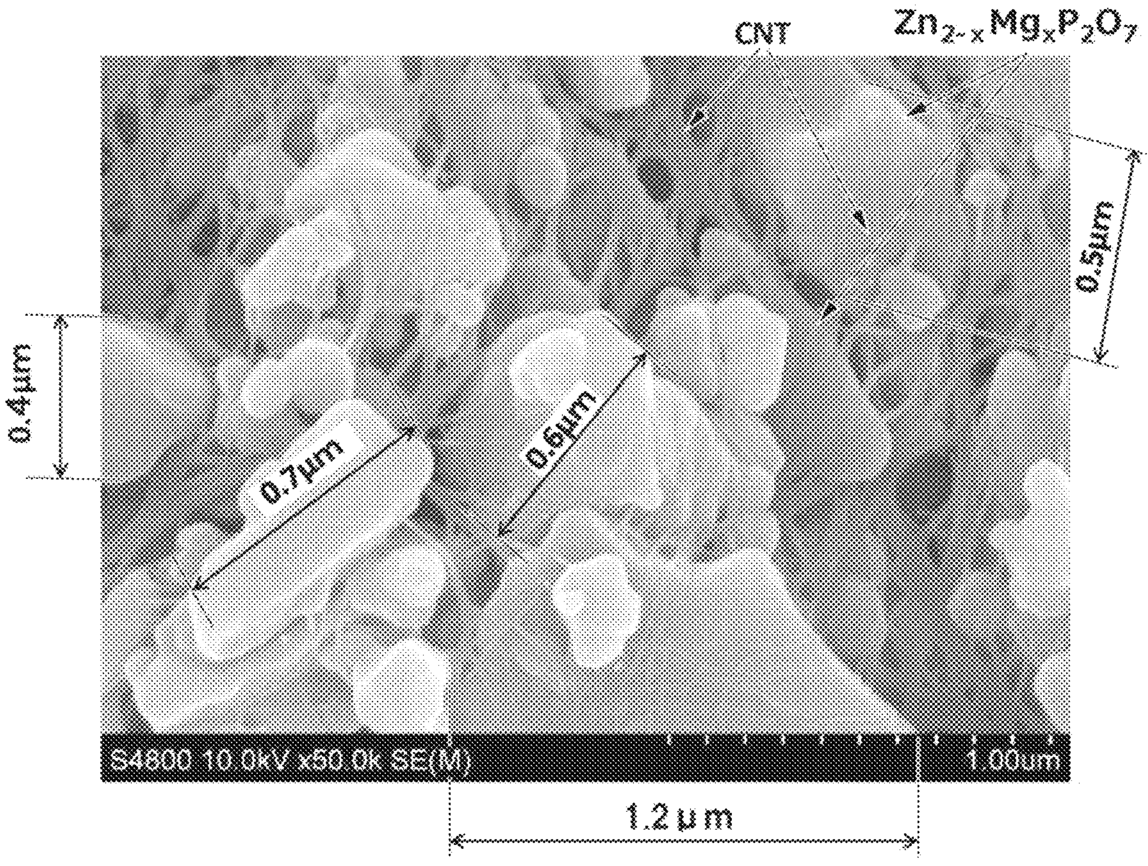
FIG. 18 is a SEM image showing the adhesion status of a test element in an example.

FIG. 18 shows the adhesion status of carbon nanotubes in the composite material of ZMPO and carbon nanotubes. From FIG. 18, in the composite material 1, a film 10 containing particles having a particle size of approximately 0.4 μm, particles having a particle size of approximately 0.5 μm, particles having a particle size of approximately 0.6 μm, particles having a particle size of approximately 0.7 μm, and particles having a particle size of approximately 1.2 μm is confirmed.

In this specification, the particle size of the oxide particle 101 is the maximum diameter of an outline of a single particle or a group of particles that can be confirmed in a microscopic image obtained from an imaging device included in a scanning electron microscope (SEM), a transmission electron microscope (TEM), or the like.

Figure 19:
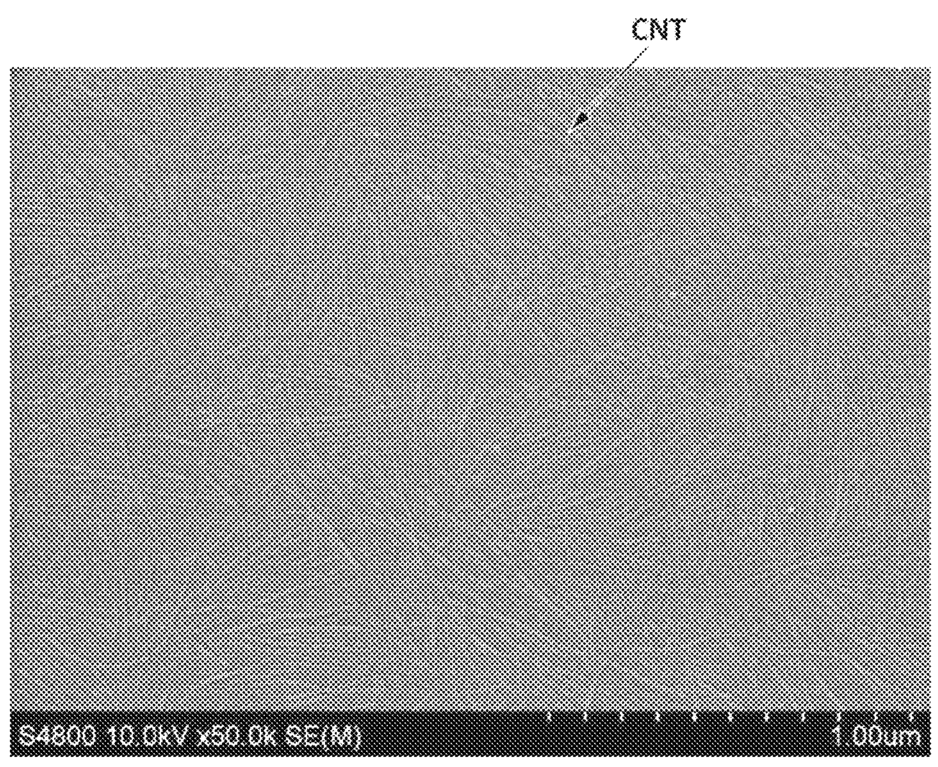
FIG. 19 is a SEM image showing the adhesion status of a test element in an example.

FIG. 19 shows the adhesion status of a single carbon nanotube.

Figure 20:
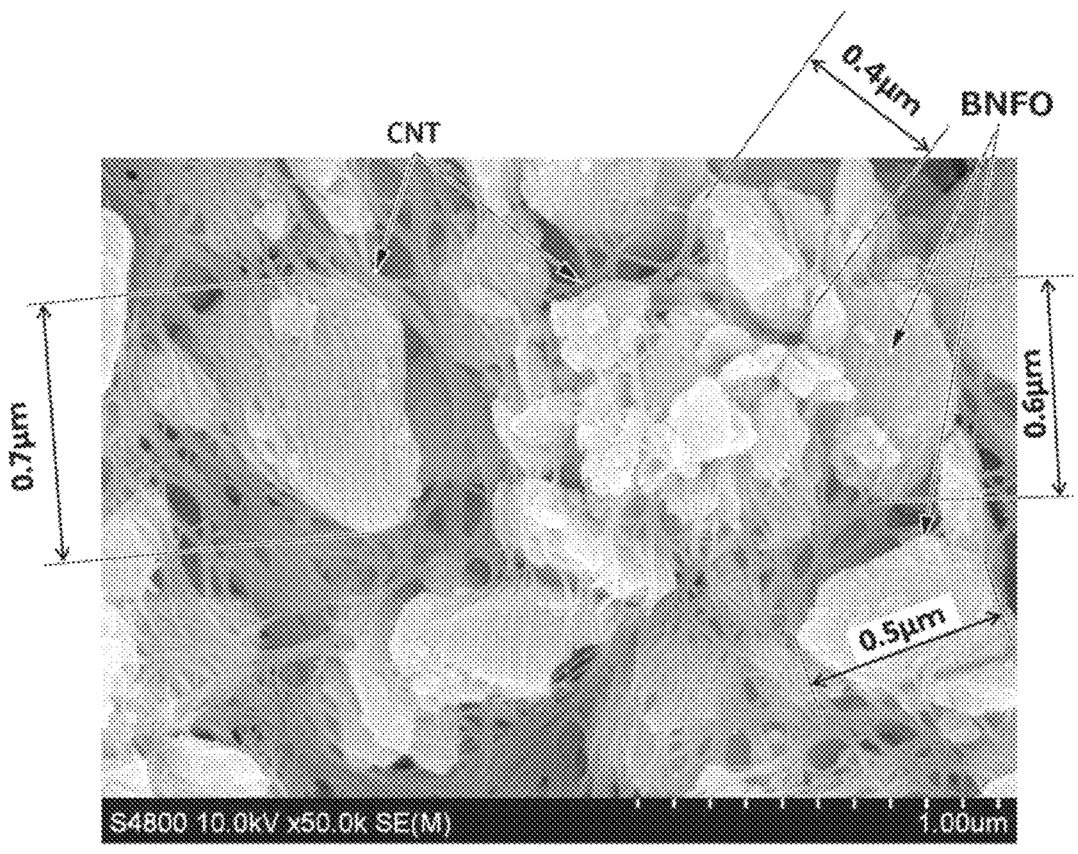
FIG. 20 is a SEM image showing the adhesion status of a test element in an example.

FIG. 20 shows the adhesion status of carbon nanotubes in the composite material of BNFO and carbon nanotubes. From FIG. 20, in the composite material 1, a film 10 containing particles having a particle size of approximately 0.4 μm, particles having a particle size of approximately 0.5 μm, particles having a particle size of approximately 0.6 μm, and particles having a particle size of approximately 0.7 μm was confirmed.

From FIGS. 17 to 20, it was confirmed that the composite material 1 contained oxide particles 101 having a specific size, which makes it easier to form a three-dimensional network structure than the adhesion status of only the carbon nanotubes.

In FIG. 17, it can be understood that the composite material of ZnO and carbon nanotubes has a negative TCR (absolute value of 2.5%/K or more) having the same absolute value as that of only the carbon nanotubes. Further, when comparison is carried out using resistance values, it can be understood that the composite material of ZnO and carbon nanotubes has a resistance value that is slightly smaller than that of only the carbon nanotubes.

Figure 21:
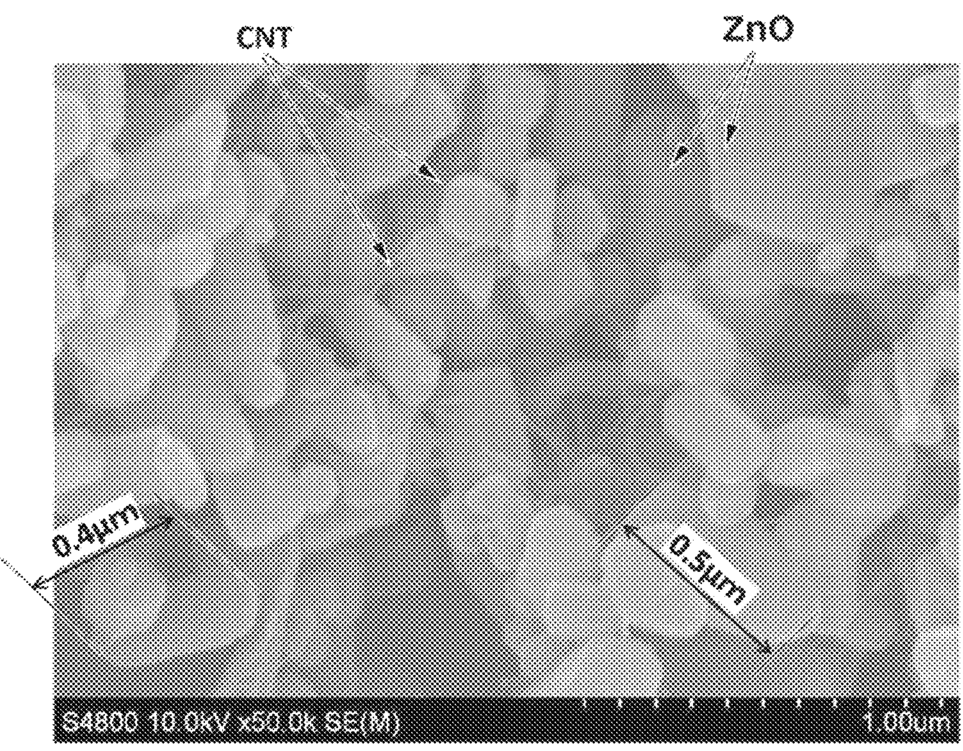
FIG. 21 is a SEM image showing the adhesion status of a test element in an example.

FIG. 21 shows the adhesion status of carbon nanotubes in the composite material of ZnO and carbon nanotubes. From FIG. 21, in the composite material 1, a film containing particles having a particle size of approximately 0.4 μm or more and particles having a particle size of approximately 0.5 μm were confirmed.

From FIGS. 17 and 21, it was confirmed that the composite material 1 contained ZnO having a specific size, which makes it easier to form a three-dimensional network structure than the adhesion status of only the carbon nanotubes.

In FIG. 17, it can be understood that the composite material of $Er_2O_3$ and carbon nanotubes has a negative TCR having an absolute value slightly smaller than that of only the carbon nanotubes. Furthermore, when comparison is carried out using resistance values, it can be understood that the composite material of $Er_2O_3$ and carbon nanotubes had a resistance value that was slightly larger than that of only the carbon nanotubes.

Figure 22:
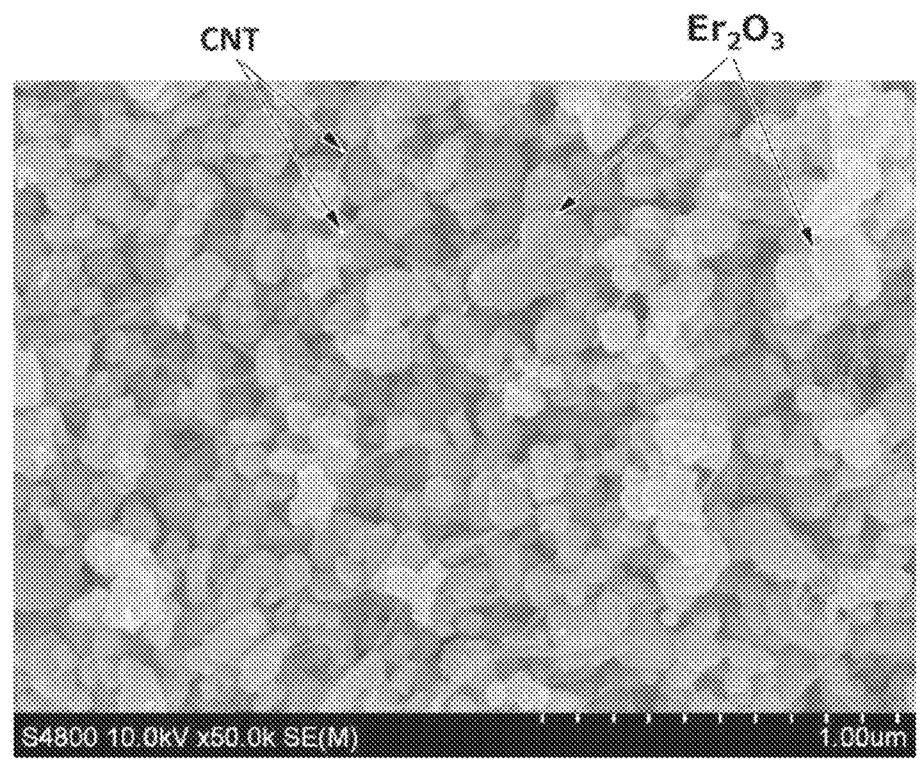
FIG. 22 is a SEM image showing the adhesion status of a test element in an example.

FIG. 22 shows the adhesion status of carbon nanotubes in the composite material of $Er_2O_3$ and carbon nanotubes.

From FIG. 17 to FIG. 22, it can be understood that the particle size of the oxide particle 101 of $Er_2O_3$ was smaller than those of other oxide particles. Furthermore, it is confirmed that carbon nanotubes were less likely to adhere than the adhesion state of only the carbon nanotubes. Thereby, it is considered that the composite material of $Er_2O_3$ and carbon nanotubes has a resistance value slightly larger than that of only the carbon nanotubes.

Example 2

In Example 2, a test element was created using the composite material forming method for the composite material 1F including ST101 to ST110.

Figure 23:
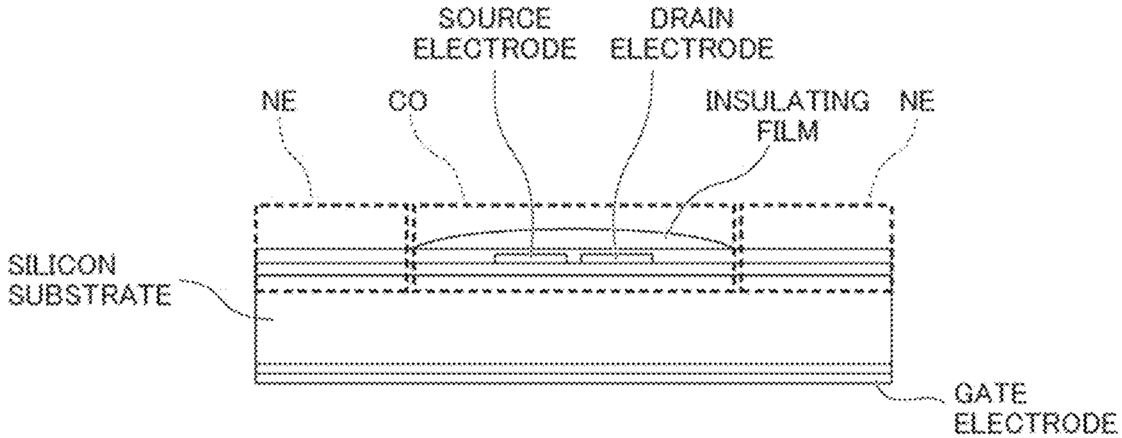
FIG. 23 is a side view of a test element in an example.

FIG. 23 shows a side view of the test element.

The configuration of the test element in Example 2 was as follows.

Electrodes were formed on a silicon substrate coated with silicon oxide. A source electrode and a drain electrode were formed on one surface, and a gate electrode was formed on the other surface. The gate electrode was formed over the entire region of the other surface. Further, the source electrode was connected to GND (ground).

The porous film 10F and the carbon nanotubes 20 are formed on one surface, and the insulating film 30 is formed on the porous film 10F on which the carbon nanotubes 20 were disposed. Assuming that a region where the insulating film 30 is formed is a region CO, the laminated state in the region CO is as shown in FIG. 11. In a region (region NE) adjacent to the region CO, the carbon nanotubes 20 are removed by oxygen plasma treatment, and only the porous film 10F is formed. The laminated state in the region NE is as shown in FIG. 9.

Furthermore, a p-type silicon substrate was used as the silicon substrate.

The electrodes included in the source electrode and the drain electrode had a laminated structure in which an Au layer (90 nm) was laminated on a Ti layer (10 nm). The electrode included in the source electrode had a laminated structure in which an Au layer (200 nm) was laminated on a Ti layer (20 nm). Patterning of the source electrode and drain electrode was carried out by a lift-off method using photolithography.

The particle size of the oxide particle 101 contained in the powder in this example was an average particle size of 1.3 μm.

In the composite material of ZMPO and carbon nanotubes created by the composite material forming method for the composite material 1F, the concentration of each liquid was adjusted at the time of creation. In this example, the operator carried out setting so that the oxide particles 101 were contained in fourth suspension at 0.1 vol %. In this example, the operator carried out setting so that the carbon nanotubes 20 were contained in the carbon nanotube dispersion liquid at 0.0029 wt %.

In ST106, the operator dripped the carbon nanotube dispersion liquid onto the porous film 10F to impregnate the carbon nanotube dispersion liquid into the porous film 10F. After dripping, the operator held the porous film 10F onto which the carbon nanotube dispersion liquid was dripped for a predetermined time. At this time, a sufficient amount of the carbon nanotube dispersion liquid was immersed in the porous film 10F.

In this example, the operator held the porous film 10F onto which the carbon nanotube dispersion liquid was dripped for 15 minutes.

The average thickness of the composite material of ZMPO and carbon nanotubes created by the composite material forming method for the composite material 1F was 3.0 μm.

In this example, the operator dropped a PMMA solution dissolved in anisole and baked it to form the insulating film 30 on the porous film 10F on which the carbon nanotubes 20 were arranged.

Figure 24:
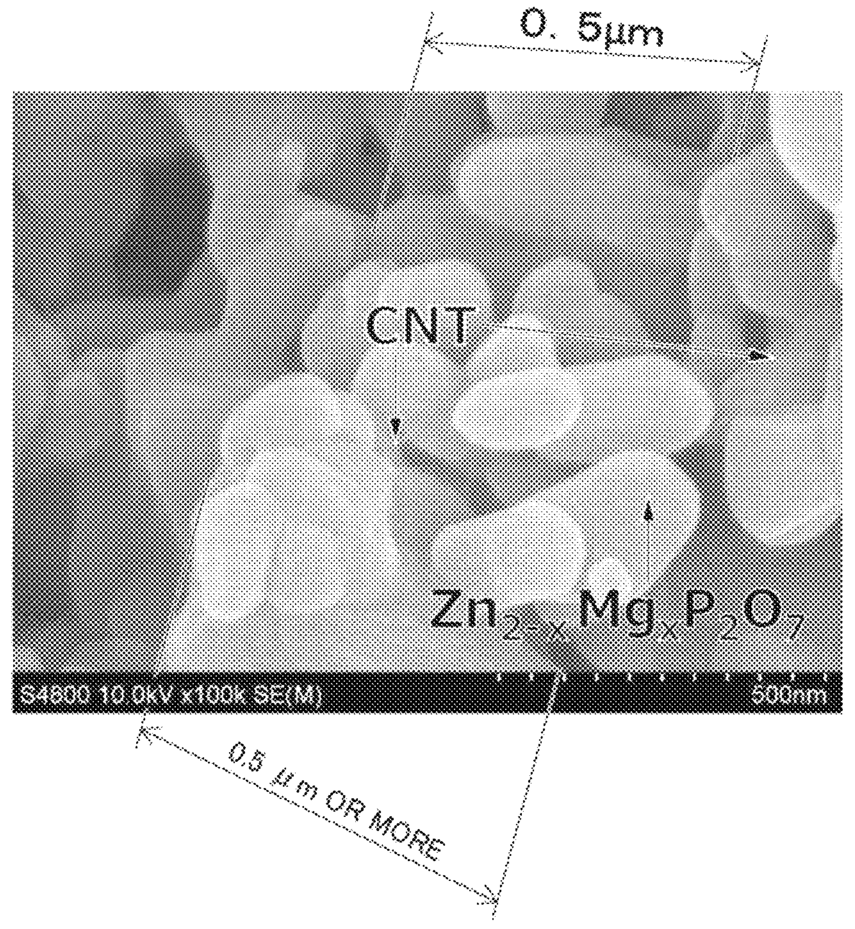
FIG. 24 is a SEM image showing the adhesion status of a test element in Example 2.

As shown in FIG. 24, the particle size of the oxide particle 101 was 0.5 μm or more. The particle size of the oxide particle 101 in Example 2 was also the maximum diameter of an outline of a single particle or a group of particles that can be confirmed in a microscopic image obtained from an imaging device included in, an SEM, a TEM, or the like as in the example disclosed above.

It was confirmed that the composite material of ZMPO and carbon nanotubes created by the composite material forming method for the composite material 1F had carbon nanotubes with a smaller diameter than the carbon nanotubes shown in FIGS. 18 to 22 of the example disclosed above.

This is considered to be because bundling of the carbon nanotubes 20 was suppressed by the composite material forming method for the composite material 1F.

Figure 25:
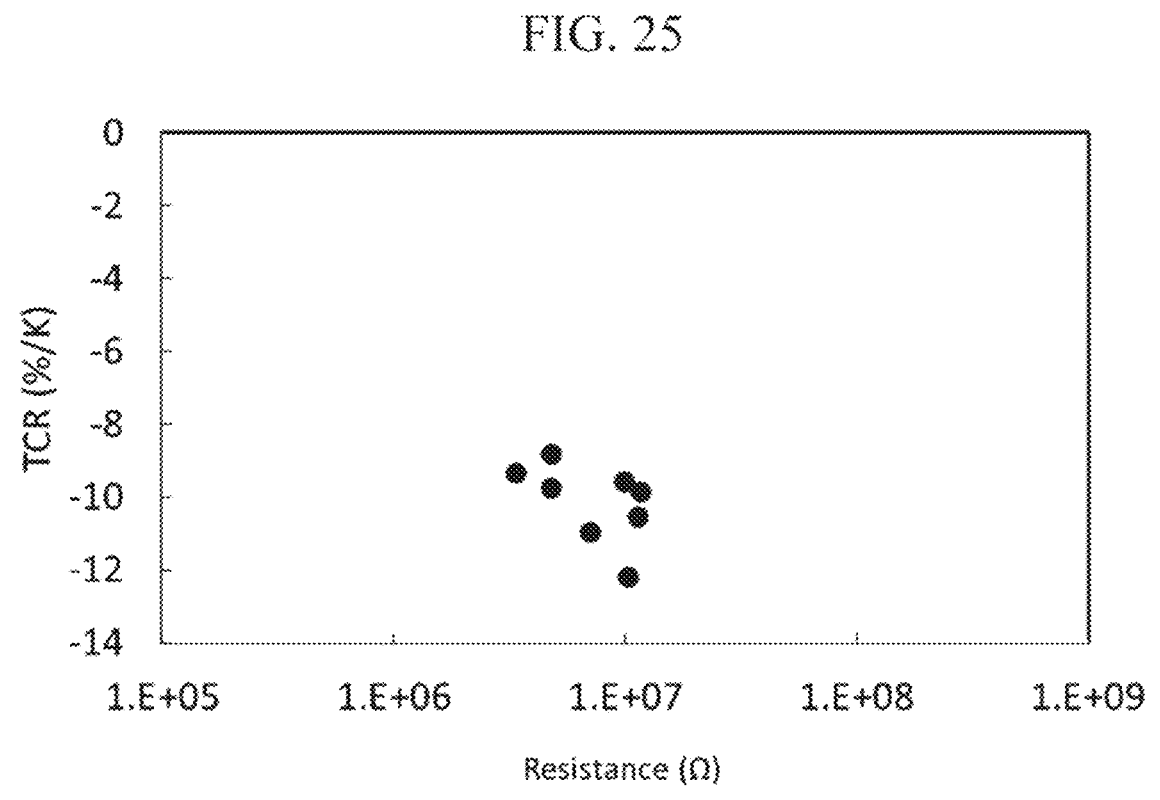

FIG. 25 shows measured values when the ambient temperature was increased from 25° C. to 30° C.

As a measurement method, measurement was carried out with the drain voltage set at −3 V and the gate electrode set at 0 V with respect to the source electrode (GND) of the test element in Example 2.

Even when I-V measurement was carried out by the measurement unit with the composite material 1F formed in the channel portion of the test element in Example 1, it is considered that there was no significant difference in characteristics. In Example 2, the purpose of fixing the gate voltage was to suppress fluctuations in the gate voltage and make the measured values more accurate.

It can be understood that the composite material of ZMPO and carbon nanotubes, which included the insulating film 30 formed using a PMMA solution dissolved in anisole, had a negative TCR (absolute value of 8.0%/K or more). It was confirmed that the composite material of this example had a larger absolute value of TCR than the absolute value of TCR shown in FIG. 17 of the example disclosed above.

One of the reasons for this is considered to be that bundling of the carbon nanotubes 20 was suppressed by the composite material forming method for the composite material 1F.

It is considered that a doping action is likely to be carried out on the carbon nanotubes 20 from the insulating film 30 formed using oxide particles or a PMMA solution dissolved in anisole, and this may be one of the reasons.

It was confirmed that the composite material of ZMPO and carbon nanotubes created by the composite material forming method for the composite material 1F had a sheet resistance of 250 MΩ or less at an ambient temperature of 25° C. The sheet resistance was obtained by multiplying the resistance value in FIG. 25 by an aspect ratio (×25). In Example 2, the size of the channel portion of the test element was 500 μm×20 μm, and the aspect ratio was 25:1.

From the above, it can be understood that the oxide particles 101 preferably satisfy the following conditions.

It is desirable that the maximum diameter of a particle outline estimated from an outline of a single particle or a group of particles obtained from a microscope image was a certain particle size with respect to the length of the carbon nanotube. For example, the oxide particle 101 had a particle size of at least 0.4 μm or more. It was confirmed that the network structure containing particles of a specific size made it easier to form a three-dimensional network structure than a network structure of only the carbon nanotubes.

It is also desirable that TCR have an absolute value of 2.5%/K or more and be a value obtained when the ambient temperature was changed from 20° C. to 25° C.

Further, it is desirable that the composite material 1 have a sheet resistance of 30 MΩ or less at an ambient temperature of 20° C.

Although the example embodiments of the present disclosure have been described above, the present example embodiments are shown as an example and is not intended to limit the scope of the disclosure. The present example embodiments can be implemented in various other forms, and various omissions, substitutions, and changes can be made without departing from the gist of the present disclosure. The present example embodiments and its modifications are included within the scope and gist of the present disclosure, as well as within the scope of the present disclosure and its equivalents. Each of the example embodiments can be combined with other example embodiments.

Some or all of the above-described example embodiments may be described as in the following Supplementary notes, but are not limited to the following.

Supplementary Note 1

A composite material including:

a film containing oxide particles having a particle size of at least 0.4 μm or more; and carbon nanotubes forming a network on a surface of the oxide particles.

Supplementary Note 2

The composite material according to supplementary note 1, wherein the oxide particles contain at least a pyrophosphate.

Supplementary Note 3

The composite material according to supplementary note 2, wherein a composition of the pyrophosphate is $Zn_{2-z}Mg_xP_2O_7$ where 0≤x≤2.

Supplementary Note 4

The composite material according to supplementary note 2, wherein a composition of the pyrophosphate is $Zn_{2-z}Mg_zP_2O_7$ where z=0.4.

Supplementary Note 5

The composite material according to any one of Supplementary notes 1 to 4, wherein the film contains a silane coupling agent.

Supplementary Note 6

The composite material according to any one of supplementary notes 1 to 4, wherein the composite material has a temperature coefficient of resistance showing a negative value.

Supplementary Note 7

The composite material according to any one of supplementary notes 1 to 4, wherein the carbon nanotube is a semiconducting carbon nanotube.

Supplementary Note 8

The composite material according to any one of supplementary notes 1 to 4, wherein the composite material has a temperature coefficient of resistance having an absolute value of 2.5%/K or more, and the temperature coefficient of resistance is a value obtained when an ambient temperature is changed from 20° C. to 25° C.

Supplementary Note 9

The composite material according to supplementary note 8, wherein the composite material has a sheet resistance of 30 MΩ or less at the ambient temperature of 20° C.

Supplementary Note 10

A bolometer including:

the composite material according to any one of supplementary notes 1 to 4;

a substrate on which the composite material is disposed; and an electrode electrically connected to the carbon nanotubes.

Supplementary Note 11

A composite material forming method including:

creating a solution containing a silane coupling agent;

adding powder containing oxide particles to the solution to create a suspension;

creating a carbon nanotube dispersion liquid;

creating a liquid containing the carbon nanotube dispersion liquid and the powder; and dripping the liquid containing the carbon nanotube dispersion liquid and the powder to form a film containing oxide particles having a particle size of at least 0.4 μm or more.

Supplementary Note 12

The composite material forming method according to supplementary note 11, wherein a concentration of the carbon nanotubes in the carbon nanotube dispersion liquid is 0.0019 wt % to 0.0039 wt %, and a concentration of the oxide particles in the liquid containing the carbon nanotube dispersion liquid and the powder is 0.02 vol % to 0.25 vol %.

Supplementary Note 13

A composite material forming method comprising:

forming a porous film containing the oxide particles by dripping a suspension containing oxide particles having a particle size of at least 0.4 μm or more and drying the suspension; and impregnating a carbon nanotube dispersion liquid into the porous film.

Supplementary Note 14

The composite material forming method according to supplementary note 13, wherein the impregnating includes dripping the carbon nanotube dispersion liquid onto the porous film to impregnate the carbon nanotube dispersion liquid.

Supplementary Note 15

The composite material forming method according to supplementary note 13, wherein the impregnating includes immersing the porous film in the carbon nanotube dispersion liquid to impregnate the carbon nanotube dispersion liquid, and pulling up the immersed porous film.

Supplementary Note 16

The composite material forming method according to any one of supplementary notes 13 to 15, wherein the forming of the porous film includes carrying out oxygen plasma treatment on the oxide particles after the drying and carrying out treatment with a silane coupling agent after the oxygen plasma treatment.

According to the composite material, the bolometer, and the composite material forming method of the present disclosure, it is easy to form a network of carbon nanotubes.

What is claimed is:

1. A composite material comprising:

a film containing oxide particles having a particle size of 0.4 μm or more; and carbon nanotubes forming a network on a surface of the oxide particles, wherein the oxide particles contain a pyrophosphate, and a composition of the pyrophosphate is $Zn_{2-x}Mg_xP_2O_7$ where 0≤x≤2.

2. The composite material according to claim 1, wherein the composition is $Zn_{2-z}Mg_zP_2O_7$ where z=0.4.

3. The composite material according to claim 1, wherein the film contains a silane coupling agent.

4. The composite material according to claim 1, wherein the composite material has a temperature coefficient of resistance showing a negative value.

5. The composite material according to claim 1, wherein the carbon nanotubes are a semiconducting carbon nanotube.

6. The composite material according to claim 1, wherein the composite material has a temperature coefficient of resistance having an absolute value of 2.5%/K or more, and the temperature coefficient of resistance is a value obtained when an ambient temperature is changed from 20° C. to 25° C.

7. The composite material according to claim 6, wherein the composite material has a sheet resistance of 30 MΩ or less at the ambient temperature of 20° C.

8. A bolometer comprising:

the composite material according to claim 1;

a substrate on which the composite material is disposed; and an electrode electrically connected to the carbon nanotubes.

9. A composite material forming method comprising:

creating a solution containing a silane coupling agent;

adding powder containing oxide particles to the solution to create a suspension;

creating a carbon nanotube dispersion liquid;

creating a liquid containing the carbon nanotube dispersion liquid and the powder; and dripping the liquid containing the carbon nanotube dispersion liquid and the powder to form a film containing oxide particles having a particle size of 0.4 μm or more, wherein the oxide particles contain a pyrophosphate, and a composition of the pyrophosphate is $Zn_{2-x}Mg_xP_2O_7$ where 0≤x≤2.

10. The composite material forming method according to claim 9, wherein a concentration of the carbon nanotubes in the carbon nanotube dispersion liquid is 0.0019 wt % to 0.0039 wt %, and a concentration of the oxide particles in the liquid containing the carbon nanotube dispersion liquid and the powder is 0.02 vol % to 0.25 vol %.

11. A composite material forming method comprising:

forming a porous film containing the oxide particles by dripping a suspension containing oxide particles having a particle size of 0.4 μm or more and drying the suspension; and impregnating a carbon nanotube dispersion liquid into the porous film, wherein the oxide particles contain a pyrophosphate, and a composition of the pyrophosphate is $Zn_{2-x}Mg_xP_2O_7$ where 0≤x≤2.

12. The composite material forming method according to claim 11, wherein the impregnating includes dripping the carbon nanotube dispersion liquid onto the porous film to impregnate the carbon nanotube dispersion liquid.

13. The composite material forming method according to claim 11, wherein the impregnating includes immersing the porous film in the carbon nanotube dispersion liquid to impregnate the carbon nanotube dispersion liquid, and pulling up the immersed porous film.

14. The composite material forming method according to claim 11, wherein the forming of the porous film includes carrying out oxygen plasma treatment on the oxide particles after the drying and carrying out treatment with a silane coupling agent after the oxygen plasma treatment.

* * * * *